(12) United States Patent
Slade (10) Patent No.: US 11,469,022 B2
(45) Date of Patent: Oct. 11, 2022

(54) HTS MAGNET QUENCH INITIATION SYSTEM

(71) Applicant: Tokamak Energy Ltd, Abingdon (GB)

(72) Inventor: Robert Slade, Abingdon (GB)

(73) Assignee: Tokamak Energy Ltd., Abingdon (GB)

( * ) Notice: Subject to any disclaimer, the term of this patent is extended or adjusted under 35 U.S.C. 154(b) by 182 days.

(21) Appl. No.: 16/965,811

(22) PCT Filed: Jan. 30, 2019

(86) PCT No.: PCT/GB2019/050242
§ 371 (c)(1),
(2) Date: Jul. 29, 2020

(87) PCT Pub. No.: WO2019/150092
PCT Pub. Date: Aug. 8, 2019

(65) Prior Publication Data
US 2021/0050134 A1    Feb. 18, 2021

(30) Foreign Application Priority Data

Jan. 31, 2018 (GB) ..................................... 1801604

(51) Int. Cl.
*H01F 6/00* (2006.01)
*H01F 6/02* (2006.01)
(Continued)

(52) U.S. Cl.
CPC ............... *H01F 6/02* (2013.01); *G21B 1/057* (2013.01); *H01F 6/06* (2013.01); *H02H 7/001* (2013.01)

(58) Field of Classification Search
CPC .. H01F 6/02; H01F 6/06; G21B 1/057; H02H 7/001; Y02E 30/10; H01L 39/20
(Continued)

(56) References Cited

U.S. PATENT DOCUMENTS 4,262,215 A * 4/1981 Yanabu ................ H01H 33/596
307/147
5,659,277 A * 8/1997 Joshi ........................ H01F 6/06
505/211
(Continued)

FOREIGN PATENT DOCUMENTS

EP    1681731 A1    7/2006
EP    2575187 A2    4/2013

OTHER PUBLICATIONS

International Preliminary Report on Patentability for Application No. PCT/GB2019/050242 dated Aug. 4, 2020 (6 pages).
(Continued)

Primary Examiner — Shawki S Ismail
Assistant Examiner — Lisa N Homza
(74) Attorney, Agent, or Firm — Michael Best & Friedrich LLP (57) ABSTRACT

A device comprising a high temperature superconductor, HTS, circuit; wherein the HTS circuit comprises: a quenchable section comprising HTS material and connected in series to other elements of the HTS circuit, the HTS material comprising a stack of HTS takes comprising at least one HTS tape; the device further comprising: a quenching system configured to quench the HTS material in the quenchable section; a quench protection system configured to detect temperature rises in the HTS circuit and, in response to detection of a temperature rise, cause the quenching system to quench the superconducting material in the quenchable section in order to dump stored magnetic energy from the HTS circuit into the quenchable section; wherein the HTS circuit is configured such that, when in use, the magnetic field on the or each HTS tape is substantially parallel to a a-b plane of the HTS tape, and the quenching system is configured to quench the HTS material by producing an additional magnetic field along the length of the or each HTS tape (Continued)

within the quenchable section, such that the additional magnetic field has a component perpendicular to the a-b plane of the HTS tape.

15 Claims, 4 Drawing Sheets

(51) Int. Cl.
*G21B 1/05* (2006.01)
*H01F 6/06* (2006.01)
*H02H 7/00* (2006.01)

(58) Field of Classification Search
USPC .......................................................... 335/216
See application file for complete search history.

(56) References Cited

U.S. PATENT DOCUMENTS

| | | | |
|---|---|---|---|
| 2004/0155551 A1 | 8/2004 | Mawardi | |
| 2006/0217269 A1 | 9/2006 | Bock et al. | |
| 2006/0221517 A1 | 10/2006 | Yuan et al. | |
| 2006/0274458 A1 | 12/2006 | Tekletsadik | |
| 2006/0279388 A1 | 12/2006 | Tekletsadik | |
| 2008/0144247 A1 | 6/2008 | Elschner et al. | |
| 2011/0034337 A1 | 2/2011 | Dommerque et al. | |
| 2015/0213930 A1* | 7/2015 | Hahn | H01F 41/048 29/599 |
| 2016/0064128 A1 | 3/2016 | Kummeth | |
| 2017/0278608 A1 | 9/2017 | Kusunoki et al. | |
| 2019/0252104 A1* | 8/2019 | Slade | H01F 6/065 |
| 2019/0287699 A1* | 9/2019 | Schwartz | G01L 1/242 |
| 2020/0091702 A1* | 3/2020 | Noonan | G21B 1/21 |
| 2020/0381155 A1* | 12/2020 | Slade | H01F 6/02 |
| 2021/0043333 A1* | 2/2021 | Langtry | H01F 27/06 |
| 2021/0184096 A1* | 6/2021 | Fukushima | H01L 39/2448 |
| 2021/0407716 A1* | 12/2021 | Radovinsky | H01F 41/048 |
| 2022/0016442 A1* | 1/2022 | Slade | H01F 6/006 |

OTHER PUBLICATIONS

Search Report issued by the United Kingdom Intellectual Property Office for Application No. 1801604.8 dated Jul. 20, 2018 (5 pages).
International Search Report and Written Opinion for Application No. PCT/GB2019/050242 dated Jun. 24, 2019 (12 pages).
Van Nugteren et al., "E3SPreSSO: A Quench Protection System for High Field Superconducting Magnets," Technical Report CERN, Oct. 24, 2016, pp. 1-5.

* cited by examiner

HTS MAGNET QUENCH INITIATION SYSTEM

FIELD OF THE INVENTION

The invention relates to superconducting devices. More particularly, the invention relates to methods and apparatus for quench protection in such devices, and especially in magnets for use in nuclear fusion reactors.

BACKGROUND

A superconducting magnet is an electromagnet formed from coils of a superconducting material. As the magnet coils have zero resistance, superconducting magnets can carry high currents with zero loss (though there will be some losses from non-superconducting components), and can therefore reach high fields with lower losses than conventional electromagnets.

Superconductivity only occurs in certain materials, and only at low temperatures. A superconducting material will behave as a superconductor in a region defined by the critical temperature of the superconductor (the highest temperature at which the material is a superconductor in zero applied magnetic field) and the critical field of the superconductor (the highest magnetic field in which the material is a superconductor at 0K). The temperature of the superconductor and the magnetic field present limit the current which can be carried by the superconductor without the superconductor becoming resistive (or "normal", used herein to mean "not superconducting"). There are two types of superconducting material: type I superconductors totally exclude magnetic flux penetration and have a low critical field, type II allow flux to penetrate the superconductor above the lower critical field within localized normal regions called flux vortices. They cease to be superconducting at the upper critical field. This feature enables them to be used in wires for construction of superconducting magnets. Significant effort is made to pin the flux vortex sites to the atomic lattice, which improves critical current at higher magnetic fields and temperatures.

Superconducting materials are typically divided into "high temperature superconductors" (HTS) and "low temperature superconductors" (LTS). LTS materials, such as Nb and NbTi, are metals or metal alloys whose superconductivity can be described by BCS theory. All low temperature superconductors have a critical temperature (the temperature above which the material cannot be superconducting even in zero magnetic field) below about 30K. The behaviour of HTS material is not described by BCS theory, and such materials may have critical temperatures above about 30K (though it should be noted that it is the physical differences in superconducting operation and composition, rather than the critical temperature, which define HTS material). The most commonly used HTS are "cuprate superconductors"- ceramics based on cuprates (compounds containing a copper oxide group), such as BSCCO, or ReBCO (where Re is a rare earth element, commonly Y or Gd). Other HTS materials include iron pnictides (e.g. FeAs and FeSe) and magnesium diboride ($MgB_2$).

Figure 1:
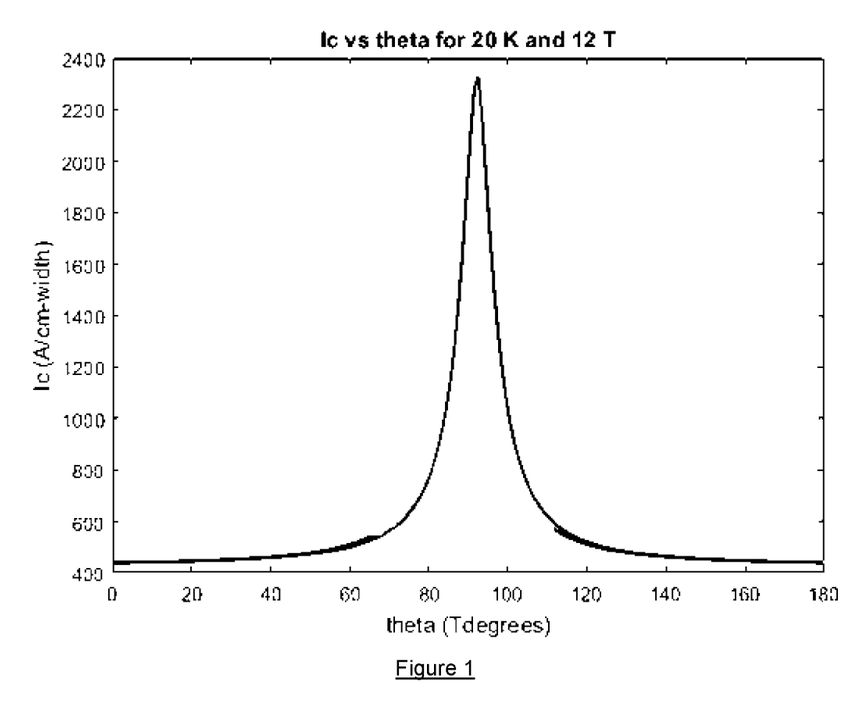
FIG. 1 is a graph of critical current against magnetic field angle for an HTS tape.

ReBCO is typically manufactured as tapes, with a structure as shown in FIG. 1. Such tape 500 is generally approximately 100 microns thick, and includes a substrate 501 (typically electropolished hastelloy approximately 50 microns thick), on which is deposited by IBAD, magnetron sputtering, or another suitable technique a series of buffer layers known as the buffer stack 502, of approximate thickness 0.2 microns. An epitaxial ReBCO-HTS layer 503 (deposited by MOCVD or another suitable technique) overlays 15 the buffer stack, and is typically 1 micron thick. A 1-2 micron silver layer 504 is deposited on the HTS layer by sputtering or another suitable technique, and a copper stabilizer layer 505 is deposited on the tape by electroplating or another suitable technique, which often completely encapsulates the tape.

The substrate 501 provides a mechanical backbone that can be fed through the manufacturing line and permit growth of subsequent layers. The buffer stack 502 is required to provide a biaxially textured crystalline template upon which to grow the HTS layer, and prevents chemical diffusion of elements from the substrate to the HTS which damage its superconducting properties. The silver layer 504 is required to provide a low resistance interface from the ReBCO to the stabiliser layer, and the stabiliser layer 505 provides an alternative current path in the event that any part of the ReBCO ceases superconducting (enters the "normal" state).

One problem which can occur in superconducting magnets is quenching. Quenching occurs when a part of the superconducting wire or coil enters the resistive state. This may occur due to fluctuations in temperature or magnetic field, or physical damage or defects in the superconductor (e.g. cracks or degradation by neutron irradiation, if the magnet is used in a fusion reactor). Due to the high currents present in the magnet, when even a small part of the superconductor becomes resistive, it quickly heats up. All superconducting wires are provided with some copper stabilizer for quench protection. The copper provides an alternative path for current if the superconductor becomes normal. The more copper that is present, the slower the temperature rises in the hot spot that forms around a region of quenched conductor.

In LTS magnets, when a quench occurs the "normal zone" will propagate rapidly—on the order of a few metres per second. This occurs due to the low heat capacity of all materials at low temperature, and the fact that LTS materials are generally operated much closer to their critical temperatures. This means that a quench propagates quickly in a LTS magnet, and the stored magnetic field energy dissipated in the quench will be spread throughout the magnet, warming it up.

HTS materials, being operated at high temperatures, have a higher specific heat capacity, so the energy required to bring a section of the wire to the normal state is much greater. This means that quenches are much less likely in HTS magnets than in LTS magnets. However, it also means that the normal zone propagation velocity is much slower— on the order of a few centimetres per second compared to metres per second in LTS magnets. Since the quench will initially only affect a small volume of the magnet, only that area will be resistive—and therefore the energy dissipated during the quench will be dumped into that small volume (or, more specifically, into the copper where the current from the normal zone is diverted). This concentration of energy can cause permanent damage to the HTS tape, e.g. melting, arc discharge, etc. This is further compounded as HTS magnets are typically indirectly cooled, rather than being immersed in a bath of liquid coolant—so the local cooling power is reduced compared to LTS magnets.

The energy stored in the magnetic field is given by:

$$W = \tfrac{1}{2} \int B \cdot H \, dV$$

I.e. the greater the flux density and the larger the volume, the greater the stored energy of the magnet. The energy released by a large magnet can be on a similar order to a stick of dynamite. For an LTS magnet, this energy may be dissipated in warming the whole magnet. For an HTS magnet without quench protection, this energy may be dissipated in a small fraction of the magnet's volume. In general, a large HTS magnet will require an active quench protection system comprising a detection phase, during which the quench is detected before significant heating has occurred, followed by a dissipation phase, during which the magnet current is rapidly ramped down before the hot spot temperature rises too high.

Most HTS magnets built to date (using BSCCO and ReBCO coated conductors) do not in fact have quench protection. This is because they are mostly small, lower cost prototypes, with little stored energy, and because a quench in a well-designed HTS magnet should have a very low probability, as mentioned. The decision whether to quench protect an HTS magnet is therefore essentially an economic one: a small prototype magnet can be repaired relatively easily in the rare event that it quenches. As a consequence, quench protection technology for HTS magnets is still immature.

One application of HTS magnets is in tokamak fusion reactors. A tokamak features a combination of strong toroidal magnetic field, high plasma current and, usually, a large plasma volume and significant auxiliary heating, to provide a hot stable plasma so that fusion can occur. The auxiliary heating (for example via tens of megawatts of neutral beam injection of high energy H, D or T) is necessary to increase the temperature to the sufficiently high values required for nuclear fusion to occur, and/or to maintain the plasma current.

The problem is that, because of the large size, large magnetic fields, and high plasma currents generally required, build costs and running costs are high and the engineering has to be robust to cope with the large stored energies present, both in the magnet systems and in the plasma, which has a habit of 'disrupting'—mega-ampere currents reducing to zero in a few thousandths of a second in a violent instability.

The situation can be improved by contracting the donut-shaped torus of a conventional tokamak to its limit, having the appearance of a cored apple—the 'spherical' tokamak (ST). The first realisation of this concept in the START tokamak at Culham demonstrated a huge increase in efficiency—the magnetic field required to contain a hot plasma can be reduced by a factor of 10. In addition, plasma stability is improved, and build costs reduced.

To obtain the fusion reactions required for economic power generation (i.e. much more power out than power in), the conventional tokamak has to be huge so that the energy confinement time (which is roughly proportional to plasma volume) can be large enough so that the plasma can be hot enough for thermal fusion to occur.

WO 2013/030554 describes an alternative approach, involving the use of a compact spherical tokamak for use as a neutron source or energy source. The low aspect ratio plasma shape in a spherical tokamak improves the particle confinement time and allows net power generation in a much smaller machine. However, a small diameter central column is a necessity, which presents challenges for design of the plasma confinement magnet.

The primary attraction of HTS for tokamaks is the ability of HTS to carry high currents in intense magnetic fields. This is particularly important in compact spherical tokamaks (STs), in which the flux density on the surface of the centre column will exceed 20 T. A secondary benefit is the ability of HTS to carry high current in high magnetic field at higher temperatures than LTS, for example ~20 K. This enables use of a thinner neutron shield, resulting in higher neutron heating of the central column, which would preclude operation using liquid helium (ie: at 4.2 K or below). This in turn enables the design of a spherical tokamak with major plasma radius of less than about 2 m, for example about 1.4 m to be considered; such a device would recycle a few percent of its power output for cryogenic cooling.

Nevertheless, such magnets are much bigger than those previously designed using HTS material. The toroidal field (TF) magnet for even a relatively small tokamak would be, by far, the largest HTS magnet built to date, and represents a large magnet with high stored energy even by LTS standards. A thoroughly developed quench protection system which can cope with critical current degradation in the conductor is essential. The stored energy of the TF magnet (~4.5 T) for a spherical tokamak operating with a 60 cm major radius will be 150-200 MJ, and the TF magnet (~3 T) for a 140 cm tokamak will be in excess of 1200 MJ.

The role of a quench protection system is to detect a local quench, or "hot spot", either as soon as possible after starting, to minimise damage, or before initiation, by detecting the transfer of current from the superconductor to the copper stabilizer, and to open a circuit breaker to dump the magnet's stored energy into a resistive load. The energy dump may be achieved by routing current through a resistor outside the magnet's cryostat at room temperature, or by heating the "cold mass" of the magnet to make it become resistive, optionally using the magnet's own stored energy to artificially propagate the quench faster through the superconducting coils (so that the energy is dissipated through the whole magnet, which warms up gradually, rather than causing a steep temperature rise in the hot-spot). Artificial propagation is difficult in HTS magnets, because the heat required to quench the entire magnet is much larger than in LTS and difficult to implement in practice.

In order for a quench protection system to prevent serious damage to the magnet, the temperature of the hotspot should be kept below approximately 200 K. The time it takes for the hotspot temperature to increase from the HTS magnet's operating temperature of roughly 20 K to 200 K depends on the amount of copper stabilizer provided in the conductor. In a compact spherical tokamak carrying 35 MA in a ~35 cm radius central column (ie: engineering current density of ~90 A/mm2) the time between a quench onset and the activation of an energy dump should be less than 0.5 s to limit the hotspot temperature to less than 200 K. There are two aspects to achieving this—improving the speed of quench detection (or even detecting conditions likely to lead to a quench, so the energy can be dumped before an actual quench occurs), and improving the speed of the energy dump.

Previous work has proposed deliberately quenching sections of an HTS magnet—or LTS sections of a combined HTS/LTS magnet through the use of heaters. For example, in a toroidal field coil of a tokamak there is limited space in the central column, but plenty of space in the return limbs, so heaters may be added to the return limbs to quench the superconducting material there, dumping the magnet energy into a large section of the return limbs rather than the small region where the initial quenching occurs. However, the heat takes a small but significant time to diffuse from the heaters to the superconducting material, and heat it up to the point where the controlled quench occurs. There is a need for a faster way to cause a deliberate quench in a superconducting circuit.

SUMMARY

According to a first aspect of the invention, there is provided a device comprising a high temperature superconductor, HTS, circuit;
wherein the HTS circuit comprises:
   a quenchable section comprising HTS material and connected in series to other elements of the HTS circuit, the HTS material comprising a stack of HTS takes comprising at least one HTS tape;
the device further comprising:
   a quenching system configured to quench the HTS material in the quenchable section;
   a quench protection system configured to detect temperature rises in the HTS circuit and, in response to detection of a temperature rise, cause the quenching system to quench the superconducting material in the quenchable section in order to dump stored magnetic energy from the HTS circuit into the quenchable section;
wherein the HTS circuit is configured such that, when in use, the magnetic field on the or each HTS tape is substantially parallel to a a-b plane of the HTS tape, and the quenching system is configured to quench the HTS material by producing an additional magnetic field along the length of the or each HTS tape within the quenchable section, such that the additional magnetic field has a component perpendicular to the a-b plane of the HTS tape.

According to a second aspect of the invention, there is provided a quenching system for deliberately quenching an HTS tape in a magnetic field generally parallel to an a-b plane of the tape, the quenching system comprising a mechanism for generating a second magnetic field through the tape having a component perpendicular to the a-b plane.

Further embodiments are presented in claim 2 et seq.

DETAILED DESCRIPTION

As noted above, superconducting material will become normal (ie: develops resistance) when the current in the material is approaches and exceeds the critical current. For high temperature superconductors (HTS), the critical current depends on the temperature of the superconducting material, the strength of the magnetic field, and the direction of the magnetic field to which the HTS is exposed. The critical current is reduced by higher temperature, stronger magnetic field, and greater angle between the magnetic field and the a-b plane of the superconductor. For most commercially available ReBCO HTS tape, the a-b plane is roughly aligned with the plane of the tape, but it may diverge by as much as 35 degrees (and indeed, higher divergences may be possible ~35 degrees is just the highest angle in currently available tapes). For simplicity, the rest of this disclosure will assume the a-b plane is aligned with the plane of the tape, and the skilled person will appreciate that appropriate modifications can be made for tapes where this is not the case.

As an alternative or in addition to causing a quench by heating the magnet, a system is proposed below to cause a quench by altering the angle of the magnetic field experienced by the HTS tape. As the primary uses of HTS tape are magnets and other high-current applications, such as fault-current limiters, the external magnetic field on each HTS tape is already often very large—either by design for a magnet, or due to the presence of other high-current HTS tapes for other applications. However, as shown in FIG. 1, the dependence of the critical current on the direction of the applied field is very strong—for some commercially available tapes, the critical current will reduce by half from a change in field angle of less than 10 degrees. —A deliberately quenchable section of an HTS coil can be designed to run at $I/I_c$ ratio closer to unity (and generally would be, as reducing the amount of HTS used would be a significant cost saving).

The system performs best when the coil sections of the magnet containing HTS tapes which are to be quenched are arranged such that the magnetic field is mostly aligned with the a-b plane of the HTS ReBCO layer. This ensures that the critical current of the tape is at or near the maximum possible at that flux density and temperature. If the magnetic field is then rotated in the correct direction the critical current will fall sharply until it is below the transport current. The affected coil sections will then quench, generating heat which warms the quenched sections ensure that the critical current cannot recover after the end of magnetic field pulse.

Such a quench-initiation system should be designed to generate a magnetic field perpendicular to the ab plane in some or all of the tapes in the coil, and in at least sufficient tapes in the coil that the total critical current of the tapes exposed to extra perpendicular magnetic field would be less than the current in the tape (which may be all of the tapes in the coil). The most efficient method would be to generate a magnetic field with a large component perpendicular to the a-b plane of the tape (i.e. parallel to the c-axis of the HTS), which, when combined with the existing external field, will result in a field at an angle to the a-b plane sufficient to quench the tape. However, it is also possible to generate a magnetic field at any angle which is not parallel to the a-b plane, though a much stronger field will be required.

Figure 2:
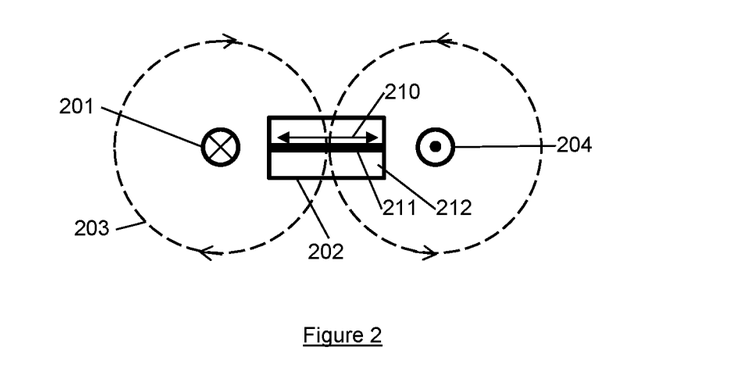
FIG. 2 is a schematic illustration of an exemplary quenching system.

One simple way to generate such a field, as shown in FIG. 2, is to pass a current through a wire 201 which runs parallel to the length of the HTS tape 202, and lies in the a-b plane 210 of the HTS tape. The HTS tape 202 comprises HTS material 211 and a non-superconducting stabiliser 212. The field 203 around such a wire will intersect the HTS tape parallel to the c-axis of the tape (i.e. perpendicular to the tape). This field may be enhanced by running a similar wire 204 on the opposite side of the HTS tape, carrying current in the opposite direction. In order to quench the HTS tape 202, a current pulse is sent through the wire(s) 201, 204, causing the wires to generate a magnetic field perpendicular to the tape, which, when combined with the existing magnetic field has the effect of momentarily rotating the field seen by the tape. Once the HTS tape 202 becomes normal due to the effect of the magnetic field, the heating caused by this will generally result in a full quench. The length of the current pulse is a balance between the need to ensure a full quench (more certain with a longer pulse) and the need to avoid damage to the wires 201, 204 (caused by sending a high current through a resistive wire).

The magnetic field pulse will necessarily be of short duration because the pulsed field generating coil will rapidly heat and the voltage needed to sustain a high DC current through it will increase. A large transient voltage, typically several thousand volts, will be required to drive a large current through the pulse generating coil, so it should be electrically insulated from the magnet coils. However, the conductors of the pulse generating coil should be located between and as close to the conductors of the magnet coil section to be quenched to generate the maximum possible pulsed field. Furthermore, the pulsed field and magnet conductors should be in as good thermal contact as possible (consistent with adequate voltage isolation) to allow the heat pulse from the pulse generating coil to diffuse into the magnet coils, further propagating the quench.

The arrangement with alternating the direction of current in adjacent pulse generator coil turns will result in a low-inductance winding. This has the further advantage of reducing the inductive voltage generated by rapidly changing current during the rising and falling edges of the pulse.

A further benefit of using a pair of wires 201, 204 is that the additional field far from the pair of wires is small, as the fields from each wire will tend to cancel each other out at long distances compared to the distance between them.

Figure 3:
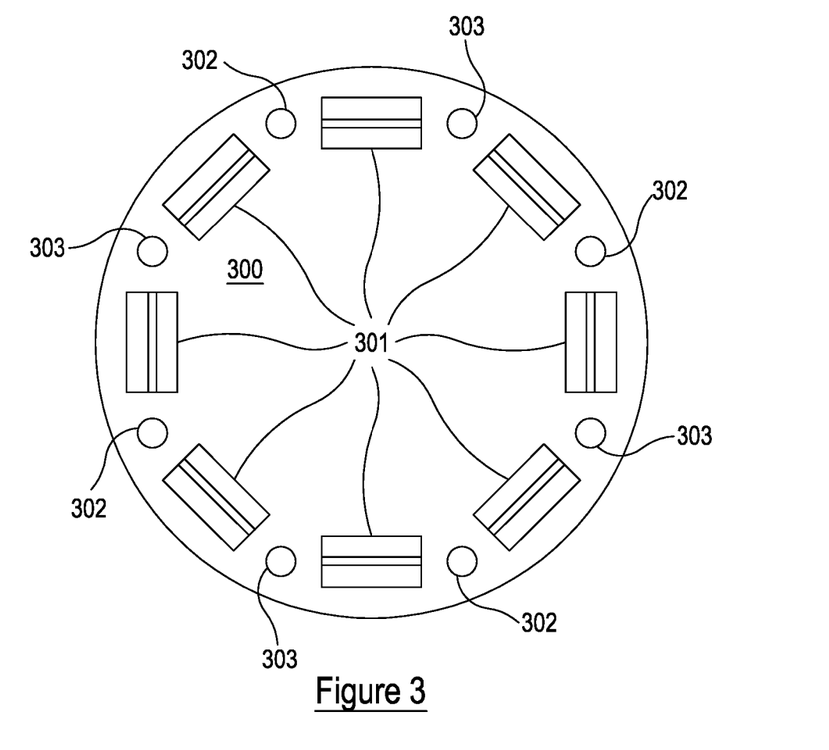
FIG. 3 is a schematic illustration of an exemplary HTS cable.

A structure is shown in FIG. 3 for a quenchable HTS cable for use in situations where the primary magnetic field on each HTS tape is from other tapes within the cable. Such a tape may be used in DC power transfer applications, or in magnets with low field sections such as the outer parts of the return limbs of a toroidal field coil. Similar principles may be applied to HTS cables for use in other situations, but the arrangement of HTS tapes within the cable will be different.

The HTS cable 300 comprises HTS tape, or stacks of tapes, 301 and wires 302, 303. The HTS tapes are arranged such that the a-b plane of the ReBCO HTS layer in the tapes 301 is perpendicular to the radius of the cable 300. The pulse generating wires 302, 303 are arranged with one wire between each of the HTS tape stacks 301. Wires 302 carry current in one direction ("out of the page" in FIG. 3) and wires 303 carry current in the opposite direction ("into the page" in FIG. 3). Each HTS tape stack 301 is adjacent to one wire 302 carrying current in one direction, and one wire 303 carrying current in the opposite direction. The effect of this arrangement is that when a pulsed current is passed through the wires 302 and 303, each HTS tape 301 experiences an additional pulsed magnetic field applied parallel to the c-axis of the HTS tape 301, which will cause the critical current of the HTS tape stacks to be reduced.

Current may be easily supplied to such an arrangement of wires by alternately connecting the tops and bottoms of each adjacent pair, and running the current through the resulting series circuit. However other arrangements with parallel connection schemes are possible, which allow the current and voltage regimes of practical pulsed current generator to be accessed.

Figure 4:
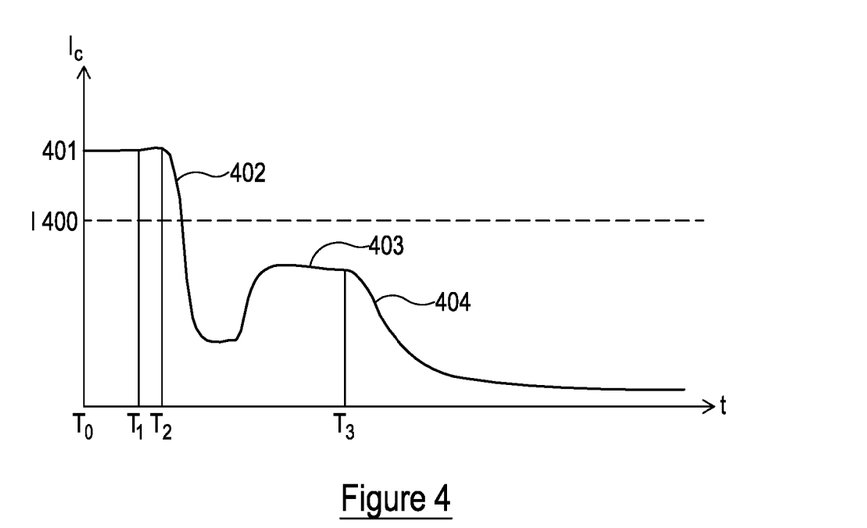
FIG. 4 is a graph of critical current against time for the HTS tape in FIG. 2.

By providing the controllable pulsed magnetic field via electrical currents running through resistive components close to the HTS tapes, the resistive components will also generate heat, which will further reduce the critical current of the HTS tapes (after a further delay, as the heat will take time to diffuse). An exemplary graph of critical current against time is shown in FIG. 4, for a system according to FIG. 2. A quench occurs elsewhere in the HTS circuit at time $T_0$, and the critical current of the quenchable section is at its normal value, 401. After a short delay, at time $T_h$ the quench is detected and a current pulse is sent to the wires 201, 204, causing the critical current of the HTS tape to drop sharply 402 to a value below the current in the HTS tape 400, causing the HTS tape to quench (along the entire length which experiences the shift in magnetic field angle). The drop 402 in the critical current occurs slightly after the current pulse, at time $T_2$, as the current pulse will induce eddy currents in the metal parts of the HTS cable which will act to oppose the change in flux. Following the current pulse, the critical current of the HTS tape could rise again (as the external magnetic field is again substantially aligned with the principle plane), but to a lower value 403 than before due to the heating caused by the quench in the HTS tape. Shortly afterwards, at time $T_3$, the critical current will fall once again 404 due to the heat from the current running through the wires 201, 204 diffusing through the intervening structure to the HTS. If the critical current following the current pulse was not sufficient to keep the HTS tape quenched, then the additional drop in critical current will ensure that this happens.

Depending on the length of the current pulse, the magnetic and electrical properties of the HTS cable, and the degree of thermal contact between the wires 201, 204 and the HTS tape 202, the heat from the current pulse may arrive during or after the pulsed magnetic field caused by the current pulse itself.

The above has described a quenching system for quenching a quenchable section of an HTS circuit. In order to provide a full quench protection system for an HTS circuit, the quenchable section is provided in series with other components of the HTS circuit, and a quench detection system is configured to detect quenches in the HTS circuit, and in response, to cause the quenching system to quench the quenchable section. The quenchable section should have a heat capacity sufficient to cause the temperature of the quenchable section to remain below a first predetermined temperature (e.g. 700K to prevent melting the stabiliser in the quenchable sections, or 200K to keep the strain in the quenchable section due to differential thermal expansion acceptable, or 100K or 50K to ensure stability of the cooling systems), and a resistivity sufficient to cause the magnet's current to decay quickly enough that the temperature of the original quenched HTS (the "hot spot") to remain below a second predetermined temperature (e.g. 700K, 300K, 100K, or 50K). This may be achieved by providing the quenchable section with a non-superconducting stabiliser comprising a metal having a ratio of resistivity to volumetric heat capacity greater than that of copper, such as stainless steel.

Figure 5:
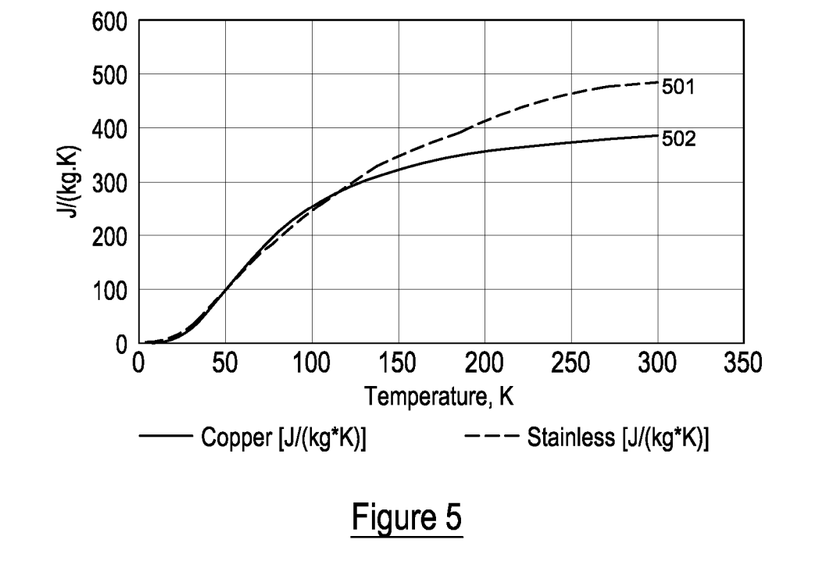
FIG. 5 is a graph of heat capacity against temperature for stainless steel and copper.
Figure 6:
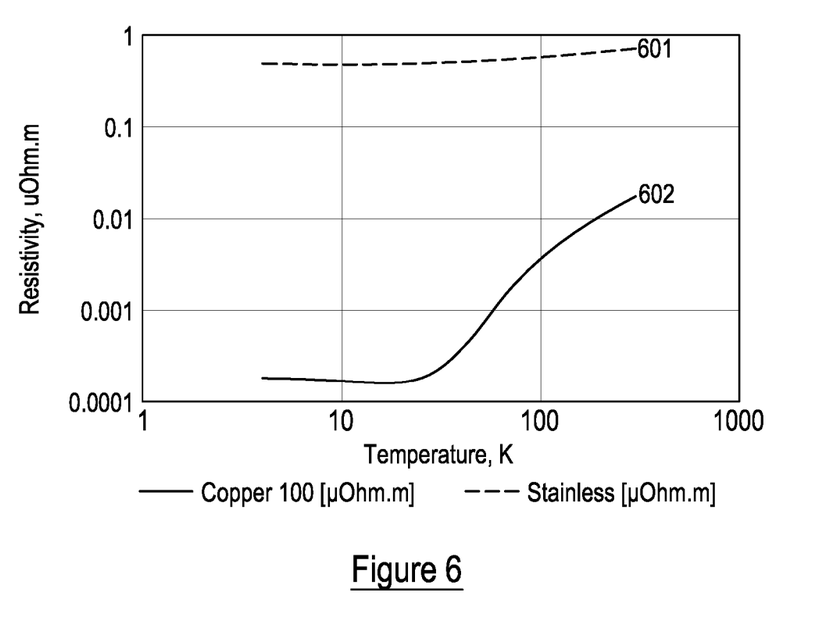
FIG. 6 is a graph of resistivity against temperature for stainless steel and copper.

In order to effectively dump energy from the HTS circuit with a minimum risk of damage to the circuit, the quenchable sections may have a resistance when not superconducting ("normal resistance") high enough to reduce the current in the HTS circuit quickly, and a heat capacity high enough to absorb the magnet's stored energy, certainly without melting, and preferably without rising much above room temperature. The hot-spot temperature at the HTS quench will be in part determined by the normal resistance of the quenchable sections (which is in part determined by the resistivity of the materials chosen), and the maximum temperature of the superconductor in the quenchable sections will be determined primarily by the heat capacity of the quenchable sections. In HTS circuits where the length of the quenchable sections is constrained, such as when the quenchable sections are provided within the return limbs of a toroidal field coil, these are conflicting requirements. The heat capacity can be increased by increasing the cross section of the quenchable section (e.g. by increasing the cross section of non-superconducting stabiliser in the quenchable section), but this would also reduce the normal resistance. Using materials other than copper for the non-superconducting stabiliser can provide an increased heat capacity without making the normal resistance too low. For example, as shown in FIGS. 5 and 6, the heat capacity of stainless steel (501) is similar to that of copper (502), but the electrical resistivity of stainless steel (601) is higher than that of copper (602). In general, a metal where the ratio of resistivity to volumetric heat capacity of the metal is greater than that ratio for copper will be suitable for such an application.

The non-copper stabiliser can be incorporated in addition to copper stabiliser—e.g. by providing a commercially available copper stabilised superconductor, within a stainless steel matrix. The ratio of copper and stainless steel should be adjusted to limit the temperature of the superconductor to a specified value, e.g. 300 K, if all of the energy of the coil is dumped into the quenchable sections. The rate of transport current decay when dumping the magnet will depend on the inductance and temperature dependent resistance of the quenchable sections.

Where the HTS circuit is a field-generating coil, the quenchable sections may be arranged to contribute to the magnetic field, or alternatively they may be arranged non-inductively (i.e. not significantly contributing to the magnetic field). The former arrangement is particularly useful for field coils such as toroidal field coils, which have sections (i.e. the return limbs) which do not contribute a significant fraction of the magnetic field in the region of interest (the plasma radius in the case of a TF coil, which is close to the centre column in a spherical tokamak. This allows the quenching system to be placed easily within the HTS cables in the return limbs. The consequential dilution of the current density in the return limbs is not significantly detrimental to the TF magnet's performance.

Figure 7:
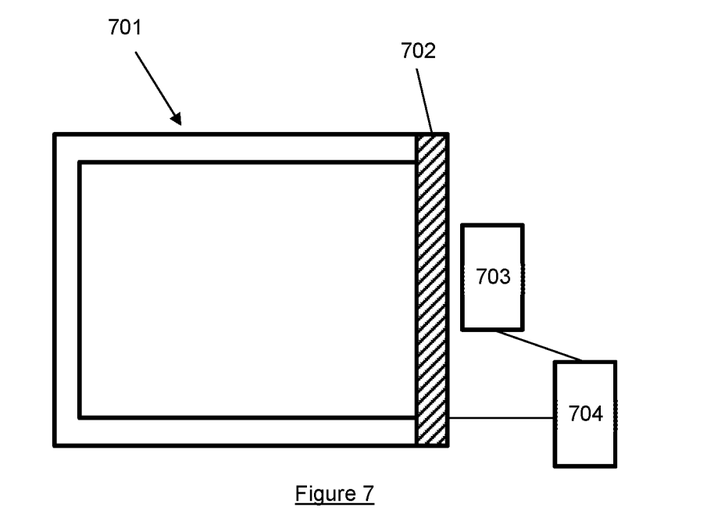
FIG. 7 is a schematic illustration of a device comprising a high temperature superconductor, HTS, circuit.

FIG. 7 illustrates a device comprising a high temperature superconductor, HTS, circuit 701. The HTS circuit comprises a quenchable section 702 comprising HTS material and connected in series to other elements of the HTS circuit, the HTS material comprising a stack of HTS tapes comprising at least one HTS tape. The device further comprises a quenching system 703 configured to quench the HTS material in the quenchable section and a quench protection system 704 configured to detect conditions likely to cause a quench in the HTS circuit and, in response to detection of conditions likely to cause a quench, cause the quenching system to quench the superconducting material in the quenchable section in order to dump stored magnetic energy from the HTS circuit into the quenchable section.

Figure 8:
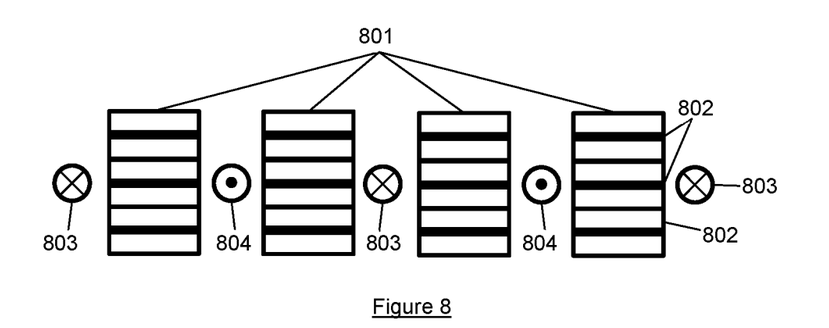
FIG. 8 shows a cross section of a quenchable section.

FIG. 8 shows a cross section of a quenchable section. The quenchable section comprises a plurality of HTS tape stacks 801, each comprising a plurality of HTS tapes 802, arranged with their a-b planes parallel to the local magnetic field. The quenching system comprises a wire 803, 804 between each pair of adjacent HTS tape stacks. The quenching system is configured to provide the additional magnetic field by passing current through the wires such that, of the two wires adjacent to each HTS tape stack, one wire 803 carries current in one direction and the other wire 804 carries current in the opposite direction.

Figure 9:
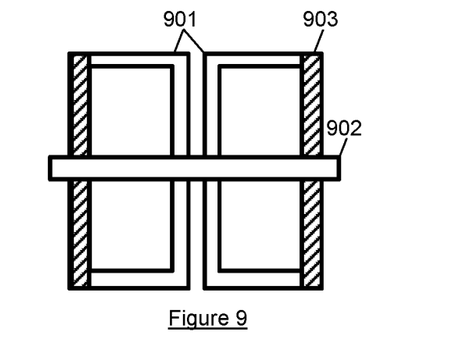
FIG. 9 shows a schematic illustration of an exemplary toroidal field coil and an exemplary poloidal field coil of a tokamak.

The above described examples may be implemented in the case where the HTS circuit is a field generating coil, and the quenchable section is a part of the field generating coil which contributes to its magnetic field. For example, FIG. 9 shows the toroidal field coil 901 and poloidal field coil 902 of a tokamak. Either the toroidal field coil or poloidal field coil may implement the above examples. In the case of a toroidal field coil one or more or all of the return limbs may be used as the quenchable sections 903.

The invention claimed is:

1. A device comprising a high temperature superconductor, HTS, circuit;
   wherein the HTS circuit comprises:
   a quenchable section comprising HTS material and connected in series to other elements of the HTS circuit, the HTS material comprising a stack of HTS tapes comprising at least one HTS tape;
   the device further comprising:
   a quenching system configured to quench the HTS material in the quenchable section;
   a quench protection system configured to detect conditions likely to cause a quench in the HTS circuit and, in response to detection of conditions likely to cause a quench, cause the quenching system to quench the superconducting material in the quenchable section in order to dump stored magnetic energy from the HTS circuit into the quenchable section;
   wherein the HTS circuit is configured such that, when in use, the magnetic field on the or each HTS tape is substantially parallel to a a-b plane of the HTS tape, and the quenching system is configured to quench the HTS material by producing an additional magnetic field along the length of the or each HTS tape within the quenchable section, such that the additional magnetic field has a component perpendicular to the a-b plane of the HTS tape.

2. A device according to claim 1, wherein each quenchable section has a heat capacity sufficient to cause a temperature of the quenchable section to remain below a first predetermined temperature when energy is dumped from the HTS circuit into the quenchable section, and a resistivity sufficient to cause decay of the HTS circuit's current quickly enough that the temperature of the part of the HTS circuit where the temperature rise was detected remains below a second predetermined temperature.

3. A device according to claim 1, wherein the quenching system is configured to quench the HTS material by producing an additional magnetic field perpendicular to the a-b plane of the HTS tape.

4. A device according to claim 1, wherein the quenching system comprises a current source and a first wire which is substantially parallel to a length of the respective HTS tape, and substantially in the a-b plane of the respective HTS tape, wherein the quenching system provides the additional magnetic field by passing current through the first wire.

5. A device cable according to claim 4, wherein the quenching system comprises a second wire on the other side of the respective HTS tape from the first wire, the second wire being substantially parallel to the length of the respective HTS tape, and substantially in the a-b plane of the respective HTS tape, wherein the quenching system provides the additional magnetic field by passing current through the first wire in one direction, and through the second wire in the opposite direction.

6. A device according to claim 5, wherein the quenchable section comprises a plurality of HTS tape stacks arranged with their a-b planes parallel to the local magnetic field, and wherein the quenching system comprises a wire between each pair of adjacent HTS tape stacks, wherein the quenching system is configured to provide the additional magnetic field by passing current through the wires such that, of the two wires adjacent to each HTS tape stack, one wire carries current in one direction and the other wire carries current in the opposite direction.

7. A device according to claim 6, wherein the wires are connected in series.

8. A device according to claim 2, wherein said first predetermined temperature is about 700 K or more preferably about 300 K.

9. A device according to claim 2, wherein said second predetermined temperature is about 300K, more preferably about 200K, more preferably about 100K.

10. A device according to claim 1, wherein each quenchable section further comprises a non-superconducting stabiliser.

11. A device according to claim 10, wherein the non-superconducting stabiliser comprises a metal having a ratio of resistivity to volumetric heat capacity greater than that of copper, such as stainless steel.

12. A device according to claim 1, wherein the HTS circuit is a field generating coil, and the quenchable section contributes towards a magnetic field of the field generating coil.

13. A device according to claim 1, wherein the HTS circuit is a toroidal field coil of a tokamak, and the quenchable section is a section of a return limb of the toroidal field coil.

14. A device according to claim 13, wherein each return limb of the toroidal field coil comprises a quenchable section.

15. A device according to claim 1, wherein the HTS circuit is a poloidal field coil of a tokamak.

\* \* \* \* \*